US012733094B2

(12) United States Patent
Lee et al.

(10) Patent No.: US 12,733,094 B2
(45) Date of Patent: Sep. 8, 2026

(54) PRINTED CIRCUIT BOARD

(71) Applicant: SAMSUNG ELECTRO-MECHANICS CO., LTD., Suwon-si (KR)

(72) Inventors: Seung Min Lee, Suwon-si (KR); Francis Saynes, Suwon-si (KR); Keun Woo Kwon, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 118 days.

(21) Appl. No.: 18/238,144

(22) Filed: Aug. 25, 2023

(65) Prior Publication Data

US 2024/0114620 A1 Apr. 4, 2024

(30) Foreign Application Priority Data

Sep. 29, 2022 (KR) ........................ 10-2022-0124116

(51) Int. Cl.
*H05K 1/11* (2006.01)
*H05K 3/3452* (2026.01)

(52) U.S. Cl.
CPC ........... *H05K 1/113* (2013.01); *H05K 3/3452* (2013.01); *H05K 2201/0939* (2013.01); *H05K 2201/094* (2013.01); *H05K 2201/099* (2013.01)

(58) Field of Classification Search
None
See application file for complete search history.

(56) References Cited

U.S. PATENT DOCUMENTS 6,228,466 B1 * 5/2001 Tsukada ............ H01L 23/49816 428/209
7,271,484 B2 * 9/2007 Reiss .................. B23K 3/0638 257/738
9,814,135 B2 * 11/2017 Nakamura ............. H05K 1/111
10,582,615 B2 * 3/2020 Noguchi ........... H01L 23/49838
2014/0247573 A1 9/2014 Kim et al.
2015/0068791 A1 3/2015 Nakamura et al.
2017/0303396 A1 * 10/2017 Nishioka .............. H05K 3/0055
2022/0192018 A1 * 6/2022 Sakai ..................... H05K 1/111

FOREIGN PATENT DOCUMENTS

JP 2015-056561 A 3/2015
JP 2022-094718 A 6/2022
KR 10-2015-0127630 A 11/2015

OTHER PUBLICATIONS

Office Action issued on Feb. 19, 2026 in corresponding Korean Patent Application No. 10-2022-0124116 with English translation.

* cited by examiner

*Primary Examiner* — Timothy J Thompson
(74) *Attorney, Agent, or Firm* — Morgan, Lewis & Bockius LLP

(57) ABSTRACT

A printed circuit board includes a first insulating layer, a plurality of first and second pads disposed on the first insulating layer, and a solder resist layer disposed on the first insulating layer, the solder resist layer having a plurality of first and second openings respectively exposing at least portions of the plurality of first and second pads. The first pad has a closed region having a side surface covered by the solder resist layer, and an open region having a side surface exposed by the first opening. The second pad has only a closed region having a side surface covered by the solder resist layer.

17 Claims, 6 Drawing Sheets

110
121
122
120
140
130

PRINTED CIRCUIT BOARD

CROSS-REFERENCE TO RELATED APPLICATION(S)

This application claims benefit of priority to Korean Patent Application No. 10-2022-0124116 filed on Sep. 29, 2022 in the Korean Intellectual Property Office, the disclosure of which is incorporated herein by reference in its entirety.

TECHNICAL FIELD

The present disclosure relates to a printed circuit board.

BACKGROUND

In order to address the recent trend for reductions in the weight and size of mobile devices, the need to implement reductions in weight, thickness, and the size of printed circuit boards mounted thereon has been gradually increasing. In response to the technical demands for such mobile devices, research has continued to improve reliability while forming a narrow gap between pads for mounting components in a board structure in which various components are mounted on a board.

SUMMARY

An aspect of the present disclosure provides a printed circuit board capable of narrowing a gap between component mounting pads in a printed circuit board for mounting electronic components and the like.

Another aspect of the present disclosure provides a printed circuit board capable of including more component mounting pads.

Another aspect of the present disclosure provides a method of manufacturing a printed circuit board capable of improving reliability.

According to an aspect of the present disclosure, there is provided a printed circuit board including a first insulating layer, a plurality of first and second pads disposed on the first insulating layer, and a solder resist layer disposed on the first insulating layer, the solder resist layer having a plurality of first and second openings respectively exposing at least portions of the plurality of first and second pads. The first pad may have a closed region having a side surface covered by the solder resist layer, and an open region having a side surface exposed by the first opening. The second pad may have only a closed region having a side surface covered by the solder resist layer.

According to another aspect of the present disclosure, there is provided a printed circuit board including an insulator having a first opening and a second opening, and first and second pads covered by the insulator. The first opening may expose at least a portion of an upper surface of the first pad and at least a portion of a side surface of the first pad. The second opening may expose at least a portion of an upper surface of the second pad, and does not expose a side surface of the second pad.

According to another aspect of the present disclosure, there is provided a printed circuit board including an insulating layer, a first pad and a second pad disposed on the insulating layer, and a solder resist layer disposed on the insulating layer, the solder resist layer having a first opening exposing not entire of an upper surface of the first pad and a second opening exposing only a portion of an upper surface of the second pad. Among the first opening and the second opening, only the first opening exposes a portion of the insulating layer.

According to example embodiments, a printed circuit board may narrow a gap between all component mounting pads.

The printed circuit board may include more component mounting pads.

The printed circuit board may improve reliability.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
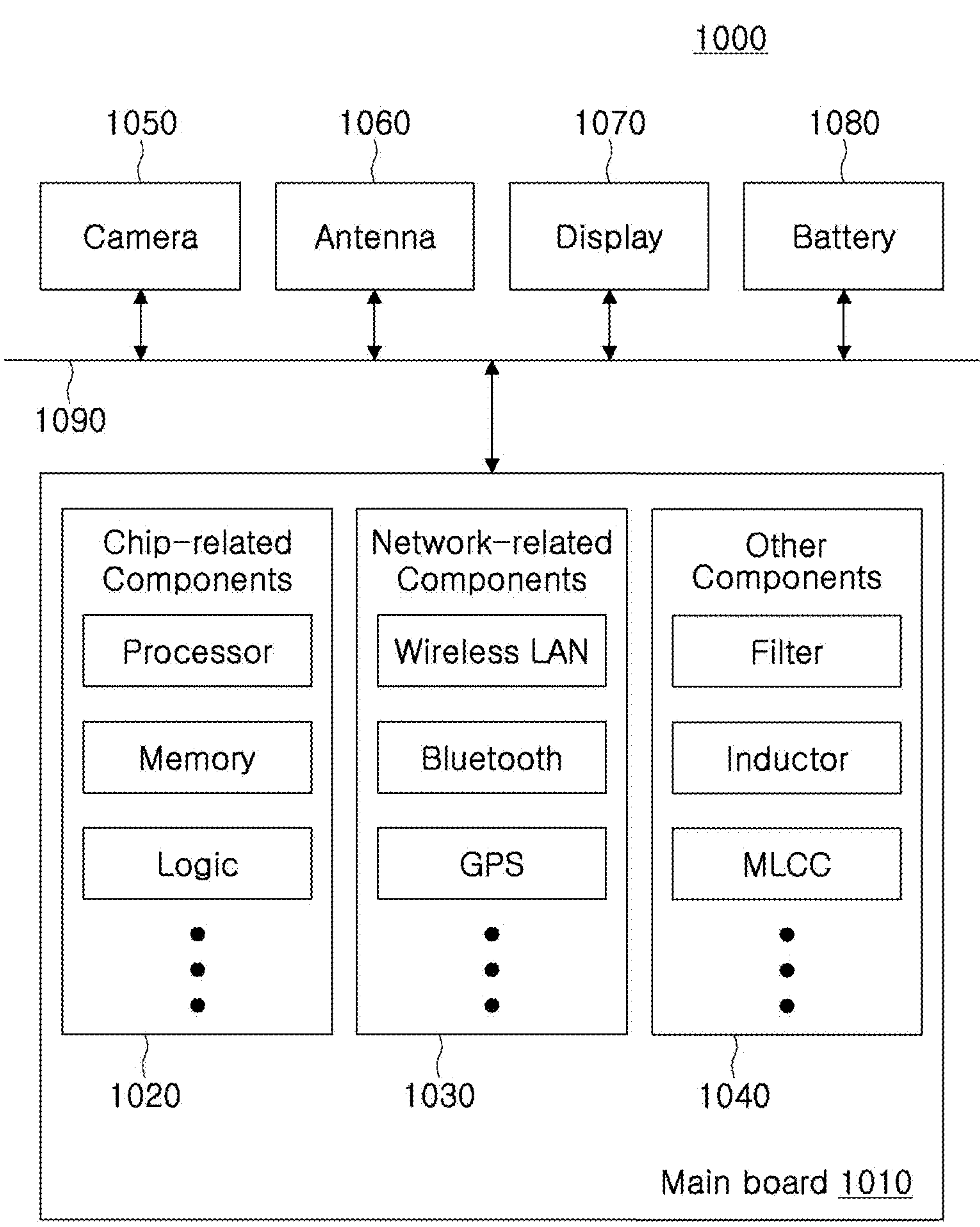
FIG. 1 is a schematic block diagram illustrating an example of an electronic device system.

Hereinafter, the present disclosure will be described with reference to the accompanying drawings. The shapes and sizes of elements in the drawings may be exaggerated or reduced for clearer description.

Electronic Device

FIG. 1 is a schematic block diagram illustrating an example of an electronic device system.

Referring to FIG. 1, an electronic device 1000 may accommodate a mainboard 1010. The mainboard 1010 may include chip-related components 1020, network-related components 1030, other components 1040, or the like, physically or electrically connected thereto. Such components may be connected to other components to be described below to form various signal lines 1090.

The chip-related components 1020 may include a memory chip such as a volatile memory (for example, a dynamic random access memory (DRAM)), a non-volatile memory (for example, a read only memory (ROM)), a flash memory, or the like, an application processor chip such as a central processor (for example, a central processing unit (CPU)), a graphics processor (for example, a graphics processing unit (GPU)), a digital signal processor, a cryptographic processor, a microprocessor, a microcontroller, or the like, and a logic chip such as an m analog-to-digital converter, an application-specific integrated circuit (ASIC), or the like, or the like. However, the chip-related components 1020 are not limited thereto, and may include other types of chip-related components. In addition, the chip-related components 1020 may be combined with each other. The chip-related components 1020 may be in the form of a package including the above-described chip or electronic component.

The network-related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth®, 3G, 4G, and 5G protocols, and any other wireless and wired protocols, designated after the above-described protocols. However, the network-related components 1030 are not limited thereto, and may also include a variety of other wireless or wired standards or protocols. In addition, the network-related components 1030 may be combined with each other, together with the chip-related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive components used for various other purposes, or the like. In addition, other components 1040 may be combined with each other, together with the chip-related components 1020 or the network-related components 1030 described above.

Depending on a type of the electronic device 1000, the electronic device 1000 may include other components that may or may not be physically or electrically connected to the mainboard 1010. The other components may include, for example, a camera 1050, an antenna 1060, a display 1070, a battery 1080, and the like. However, the other components are limited thereto, and may be an audio codec, a video codec, a power amplifier, a compass, an accelerometer, a gyroscope, a speaker, a mass storage unit (for example, a hard disk drive (HDD)), a compact disk (CD), a digital versatile disk (DVD), or the like. In addition, the other components may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device used to process data.

Figure 2:
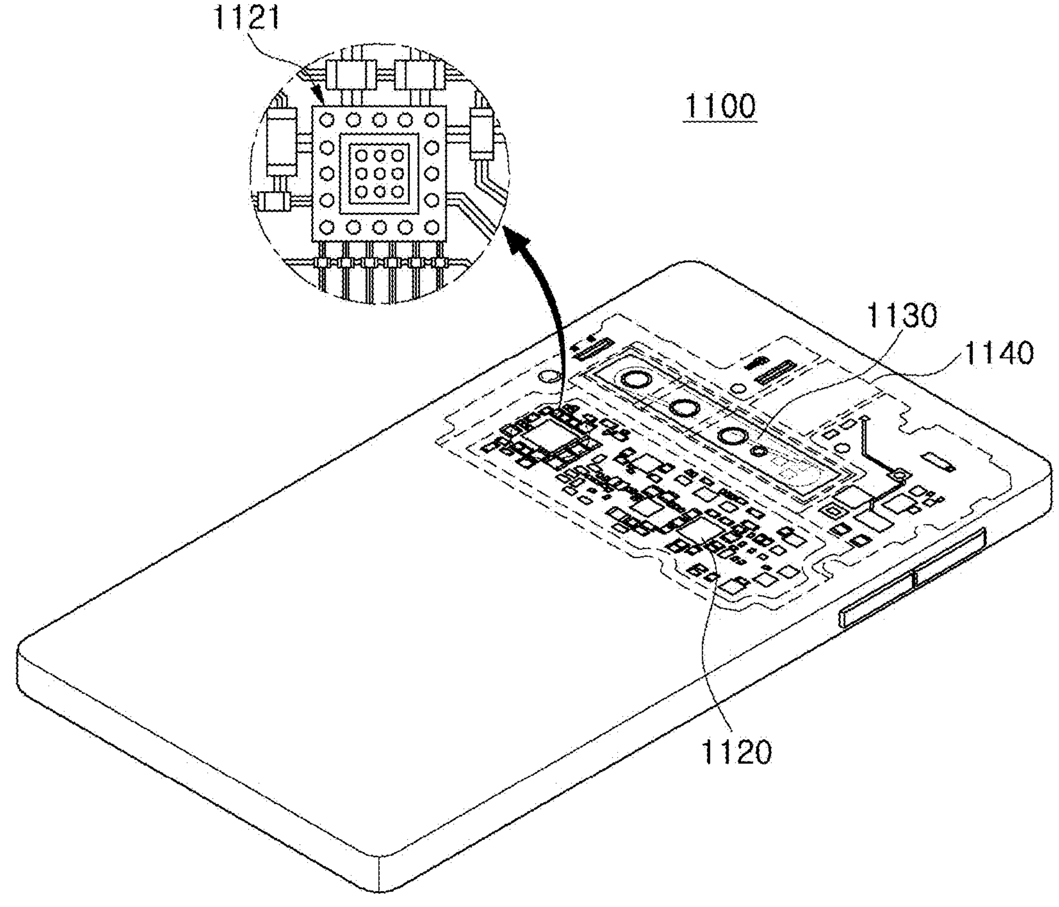
FIG. 2 is a schematic perspective view illustrating an example of an electronic device.

FIG. 2 is a schematic perspective view illustrating an example of an electronic device.

Referring to FIG. 2, an electronic device may be, for example, a smartphone 1100. The motherboard 1110 may be accommodated in the smartphone 1100, and various electronic components 1120 may be physically and/or electrically connected to the motherboard 1110. In addition, other electronic components that may or may not be physically and/or electrically connected to the motherboard 1110 may be accommodated therein, such as a camera module 1130 and/or a speaker 1140. A portion of the electronic components 1120 may be the above-described chip related components, for example, a component package 1121, but the present disclosure is not limited thereto. The component package 1121 may be in the form of a printed circuit board on which electronic components including active components and/or passive components are surface-mounted. The electronic device is not necessarily limited to the smartphone 1100, and may be other electronic devices as described above.

Printed Circuit Board

Figure 3:
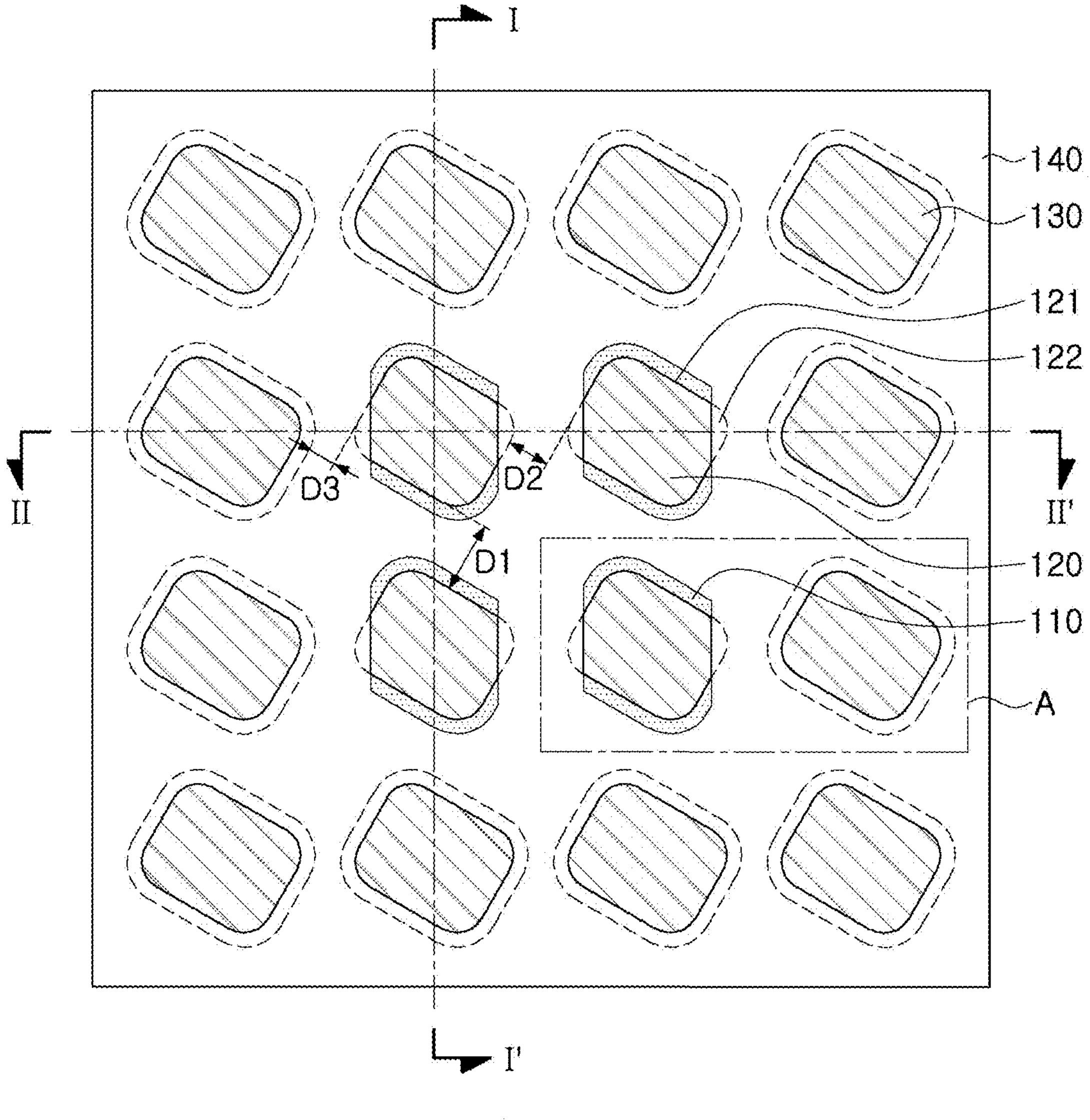
FIG. 3 is a schematic plan view of a printed circuit board according to an example.

FIG. 3 is a schematic plan view of a printed circuit board according to an example.

Referring to FIG. 3, the printed circuit board according to an example may include a first insulating layer 110, a plurality of first and second pads 120 and 130 disposed on the first insulating layer 110, and a solder resist layer 140 disposed on the first insulating layer 110, the solder resist layer 140 including first and second openings.

The first insulating layer 110 may include an insulating material. The insulating material may include a thermosetting resin such as an epoxy resin, a thermoplastic resin such as a polyimide, or a material including an inorganic filler, organic filler, and/or glass fiber, glass cloth, and/or glass fabric, together with such resins. The insulating material may be a photosensitive material and/or a non-photosensitive material. For example, the insulating material may include a solder resist, an Ajinomoto build-up film (ABF), FR-4, bismaleimide triazine (BT), prepreg (PPG), resin coated copper (RCC), a copper clad laminate (CCL), and the like, but the insulating material is not limited thereto, and may include other polymeric materials.

The first pad 120 and the second pad 130 may be disposed on the first insulating layer 110. That is, the first pad 120 and the second pad 130 may be disposed on a surface of the first insulating layer 110, and may have a structure in which the first pad 120 and the second pad 130 protrude from the first insulating layer 110, but the present disclosure is not limited thereto. Although not illustrated in FIG. 3, the first pad 120 and the second pad 130 may have a structure in which the first pad 120 and the second pad 130 are buried in the surface of the first insulating layer 110. In this case, the structure in which the first pad 120 and the second pad 130 protrude does not necessarily mean that both the first pad 120 and the second pad 130 protrude from the surface of the first insulating layer 110, and may mean that portions of the first pad 120 and second pad 130 are buried in the first insulating layer 110 while the other portions protrude. The structure in which the first pad 120 and second pad 130 are buried in the surface of the first insulating layer 110 may mean that the first pad 120 and the second pad 130 are buried in the surface of the first insulating layer 110 such that side surfaces of the first pad 120 and the second pad 130 are covered by the first insulating layer 110 and upper surfaces of the first pad 120 and the second pad 130 are exposed from the surface of the first insulating layer 110. That is, the first pad 120 and the second pad 130 disposed on the first insulating layer 110 may include both the first pad 120 and the second pad 130 disposed on the surface of the first insulating layer 110 and the first pad 120 and the second pad 130 disposed to be buried in the surface of the first insulating layer 110.

The first pad 120 and the second pad 130 may include a metal material. The metal material may include copper (Cu), aluminum (Al), silver (Ag), tin (Sn), gold (Au), nickel (Ni), lead (Pb), titanium (Ti), and/or alloys thereof, preferably copper (Cu), but the present disclosure is not limited thereto. The first pad 120 and the second pad 130 may be pads for mounting a general component, and may perform various functions according to a design. The first pad 120 and the second pad 130 may be formed by one of a semi-additive process (SAP), a modified semi-additive process (MSAP), and a subtractive process, but the present disclosure is not limited thereto.

The first pad 120 and the second pad 130 may be formed as a plurality of pads. The plurality of pads may be simultaneously formed, but the present disclosure is not limited thereto and may be formed in a stepwise manner. In addition, the first pad 120 and the second pad 130 may transmit and receive electrical signals to patterns further disposed on different layers. However, the first pad 120 and the second pad 130 may be electrically shorted from other patterns to perform a function. That is, the plurality of first pads 120 and second pads 130 may perform different functions.

The first pad 120 and the second pad 130 may have various shapes. When viewed in a top-view, the first pad 120 and the second pad 130 may have a circular, oval, or polygonal shape. The polygonal shape may be a shape with rounded corner portions. The polygonal shape may be mainly a shape such as a quadrangular shape, a hexagonal shape, or the like, but the polygonal shape is not limited thereto, and may be any shape of a figure having an angle, such as an acute angle, an obtuse angle, or a right angle. The polygonal shape with rounded corner portions may refer to a polygonal shape with curved vertex portions, but the present disclosure is not limited thereto and the vertex portions may maintain an angle. In FIG. 3, the first pad 120 and the second pad 130 are represented as having a quadrangular shape with rounded corners, but the present disclosure is not limited thereto and may have various shapes. As long as a role as a pad is performable, the shape is not limited thereto and may vary.

The solder resist layer 140 may be further disposed on the surface of the first insulating layer 110. The solder resist layer 140 may protect the printed circuit board 100A from the outside. The solder resist layer 140 may include a thermosetting resin and an inorganic filler dispersed in the thermosetting resin, but may not include a glass fiber. An insulating resin may be a photosensitive insulating resin, and a filler may be an inorganic filler and/or an organic filler, but the present disclosure is not limited thereto. However, a material of the solder resist layer 140 is not limited thereto, and other polymer materials may be used, as necessary, and a known solder resist layer 140 may be used.

The solder resist layer 140 may be disposed on the surface of the first insulating layer 110 to bury the first pad 120 and the second pad 130, but the present disclosure is not limited thereto, and may cover portions of the first pad 120 and second pad 130.

The solder resist layer 140 may include a plurality of first openings 141 and second openings 142. The first opening 141 and the second opening 142 may expose a portion of the first pad 120 and a portion of the second pad 130, respectively. That is, a portion of the first pad 120 may be exposed to the outside through the first opening 141, and a portion of the second pad 130 may be exposed to the outside through the second opening 142. In some cases, the first opening 141 and the second opening 142 may expose the first insulating layer 110 to the outside, together with the first pad 120 and the second pad 130.

The first pad 120 may include a closed region 122 having a side surface covered by the solder resist layer 140 and an open region 121 having a side surface exposed by the first opening 141 of the solder resist layer 140. In the closed region 122 of the first pad 120, an upper surface and a side surface of the first pad 120 may be covered by the solder resist layer 140. In the open region of the first pad 120, the upper surface and the side surface of the first pad 120 may not be covered by the solder resist layer 140, and the upper surface and the side surface of the first pad 120 may be exposed by the first opening 141. That is, the first opening 141 may expose at least a portion of the upper surface of the first pad 120 and at least a portion of the side surface of the first pad 120. At least a portion of a corner portion of the first pad 120 may be exposed through the first opening 141, but the present disclosure is not limited thereto.

At least a portion of the second pad 130 may be covered by the solder resist layer 140. Edge portions and corner portions of the second pad 130 may be covered by the solder resist layer 140. A side surface of the second pad 130 may be covered by the solder resist layer 140 and may have only a closed region because the side surface of the second pad 130 is not exposed to the outside. That is, the second opening 142 may expose at least a portion of an upper surface of the second pad 130, and the second opening 142 may not expose the side surface of the second pad 130. In addition, an area of a surface of the second opening 142 may be smaller than an area of the upper surface of the second pad 130. Due to the area of the surface of the second opening 142 being smaller than the area of the upper surface of the second pad 130, edge portions of the upper surface of the second pad 130 and the side surface of the second pad 130 may be covered by the solder resist layer 140.

That is, the printed circuit board according to an example may include a first pad 120 having an open region and a closed region, and a second pad 130 having only a closed region.

The first pad 120 and the second pad 130 may be disposed on the first insulating layer 110 in various manners. The first pad 120 and the second pad 130 may be arranged to be inclined on a plane (e.g., an edge of the first pad 120 and the second pad 130 may be arranged to be inclined on a plane), but the present disclosure is not limited thereto. The expression described as "on a plane" may refer to a view of a component from above, but is not necessarily limited thereto, and may be a shape when an object is cut horizontally, or a flat shape when the object is viewed in a top-view or a bottom-view. In FIG. 3, it is illustrated that the first pad 120 and the second pad 130 are arranged to be inclined at a predetermined angle rather than to be parallel or perpendicular with respect to a direction of arrangement of the first and second pads, but the present disclosure is not limited thereto, and may be arranged to be parallel or perpendicular with respect to a direction of arrangement of the first and second pads. The first pad 120 and the second pad 130 may not necessarily be arranged in the form of a lattice. A pad may be omitted, as necessary, and the pad may be buried by a solder resist.

In FIG. 3, it is illustrated that the second pad 130 surrounds the first pad 120, but the present disclosure is not limited thereto, and such a configuration is merely exemplary. An arrangement of the pads may be changed, as necessary. Not all pads may need to be arranged on the lattice. The pads may be omitted in some positions, and may not necessarily have a grid arrangement. In addition, the second pad 130 may not be necessarily disposed outside the first pad 120 to surround the first pad 120. The first pad 120 and the second pad 130 may be alternately arranged, or may not have a predetermined rule. An arrangement of the first pad 120 and the second pad 130 is not limited to the arrangement of FIG. 3.

The solder resist layer 140 may be disposed between open regions 121 of the first pads 120 adjacent to each other, but the present disclosure is not limited thereto, and the solder resist layer 140 may not be disposed between the open regions 121 of the first pads 120 adjacent to each other. When the solder resist layer 140 is disposed between the open regions 121 of the first pad 120, the solder resist layer 140 may function as a solder resist wall between the first pad 120 and the first pad 120 to perform a function of separating pads from each other when a connection means is disposed.

A distance D3 between the closed region 122 of the first pad 120 and the second pad 130 adjacent to the closed region 122 of the first pad 120 may be substantially the same as a distance D2 between the closed regions 122 of the first pads 120 adjacent to each other.

In the present disclosure, "substantially the same" is based on a concept including "approximately the same," and may include, for example, a process error or a positional deviation occurring in a manufacturing process, an error in measurement, and the like.

A distance between some components may refer to a shortest distance among vertical distances between edges of some components. For example, the distance D3 between the closed region 122 of the first pad 120 and the second pad 130 adjacent to the closed region 122 of the first pad 120 may refer to a shortest distance among vertical distances between an edge of the closed region 122 of the first pad 120 and an edge of the second pad 130.

When only a portion of a vertical distance between edges of components is measurable because a component is inclined, a distance between the components may refer to a shortest distance among distances between extension lines of two edges. For example, when the first pad 120 and the second pad 130 are arranged to be inclined, the distance D3 between the closed region 122 of the first pad 120 and the second pad 130 adjacent to the closed region 122 of the first pad 120 may refer to a shortest distance between an extension line of the edge of the closed region 122 of the first pad 120 and an extension line of the second pad 130 adjacent to the closed region 122 of the first pad 120.

When a vertical distance between edges of components is not measurable because a component is inclined, and corner portions of the components are adjacent to each other by a shortest distance, a distance between the components may refer to a shortest distance between the corner portions of the components. For example, when the first pad 120 and the second pad 130 are arranged to be inclined and corner portions are adjacent to each other by a shortest distance, the distance D3 between the closed region 122 of the first pad 120 and the second pad 130 adjacent to the closed region 122 of the first pad 120 may refer to a shortest distance between a corner portion of the closed region 122 of the first pad 120 and a corner portion of the second pad 130 adjacent to the closed region 122 of the first pad 120. Even when the first pad 120 and the second pad 130 have a circular shape, the distance D3 between the closed region 122 of the first pad 120 and the second pad 130 adjacent to the closed region 122 of the first pad 120 may refer to a shortest distance between the first pad 120 and the second pad 130.

The distance D3 between the closed region 122 of the first pad 120 and the second pad 130 adjacent to the closed region 122 of the first pad 120 may be substantially the same as the distance D2 between the closed regions 122 of the first pads 120 adjacent to each other. In the closed region 122 of the first pad 120, a side surface of the first pad 120 may be buried by the solder resist layer 140 in the same manner as the second pad 130, such that a short circuit may be relatively unlikely to occur when mounting components, thereby reducing a distance between pads. That is, since the first pad 120 has the closed region 122 and the open region 121, the distance D3 between the closed region 122 of the first pad 120 and the second pad 130 adjacent to the closed region 122 of the first pad 120 may be reduced, and thus may be substantially the same as a distance between the second pads 130 adjacent to each other, a distance between pads having all buried side surfaces, and may be substantially the same as the distance D2 between the closed regions 122 of the first pads 120 adjacent to each other.

The first pad 120 may have both the open region 121 and the closed region 122, such that the distance D2 between the closed regions 122 of the first pads 120 adjacent to each other may be the distance D1 between the open regions 121 of the first pads 120 adjacent to each other. As described above, the distance D2 between the closed regions 122 of the first pads 120 adjacent to each other may be reduced, thereby acquiring a printed circuit board in which a pad having a pitch relatively finer than that of a pad having only the open region 121 is implemented.

An area of the first pad 120 may be smaller than an area of the second pad 130. A pad including the open region 121 may be formed to be smaller than a pad having a portion of an upper surface and a side surface covered. The first pad 120 having the open region 121 may be implemented to be smaller than the second pad 130 having a side surface covered by a solder resist. The first pad 120 may be implemented such that the area of the first pad 120 is smaller than the area of the second pad 130. Thus, a printed circuit board having an arrangement of pads including the first pad 120 and the second pad 130 may include a pad arrangement having a fine pad and a fine pitch.

Although not illustrated in the drawings, an electronic component may be mounted on the first pad 120 and the second pad 130, and the electronic component may be a known active component or a passive component, but the present disclosure is not limited thereto. A substrate, for example, a printed circuit board including a redistribution layer, may be mounted, and may be connected to an interposer connecting substrates to each other or connecting a substrate and a chip to each other. The electronic component may include a connection electrode for connection to the printed circuit board, and the connection electrode may be electrically connected to the first pad 120 and the second pad 130 through a connection means. As a means for connecting the electronic component and the printed circuit board to each other, a means such as a solder ball or the like may be used, but the present disclosure is not limited thereto. Any means capable of electrically connecting, to each other, the printed circuit board with the above-described component such as the electronic component may be used.

Although not illustrated in FIG. 3, a surface treatment layer may be further included on surfaces of the first pad 120 and the second pad 130. The surface treatment layer may perform a function of improving bonding strength with a connection means for connecting electronic components to each other or improving reliability during signal transmission. The surface treatment layer will be described below.

The printed circuit board according to an example is not limited to the configuration illustrated in the drawings, and may further include a circuit pattern and an insulating layer further formed on the other surface of the first insulating layer 110. In particular, in the present disclosure, the printed circuit board may include a single layered first insulating layer 110 and solder resist layer 140, but such a configuration is merely an example. The printed circuit board may further include a general component of the printed circuit board, such as another insulating layer, another circuit pattern, a through via, a cavity, or the like. In addition, the first pad 120 and the second pad 130 are not necessarily limited to a pad disposed only on an outermost insulating layer, and may be applied to a pad formed to mount an electronic component in a cavity. That is, the printed circuit board may further include a component usable by those skilled in the art, and any component of the printed circuit board usable by those skilled in the art may be applied without limitation.

Figure 4:
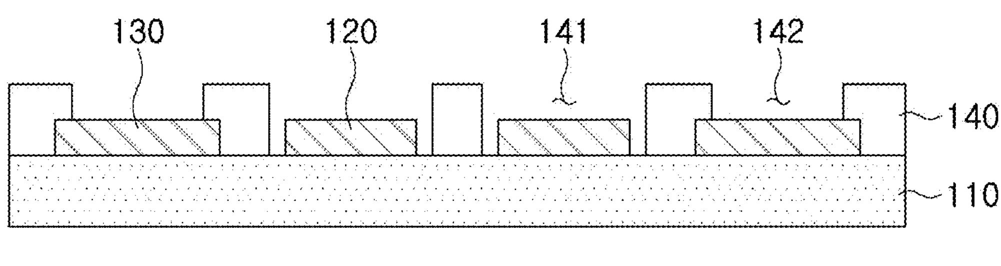
FIG. 4 is a cross-sectional view of a printed circuit board according to the example of FIG. 3 cut in a direction of line I-I'.

FIG. 4 is a cross-sectional view of the printed circuit board according to the example of FIG. 3 cut in a direction of line I-I'.

Referring to the drawings, FIG. 4 is a cross-sectional view of a printed circuit board cut in a direction of crossing the first pad 120 and the second pad 130, including the closed region 122 of the first pad 120, based on the plan view of FIG. 3. The first pad 120 and the second pad 130 may be disposed on the first insulating layer 110, and the solder resist layer 140 may be disposed on the first insulating layer 110.

Since the printed circuit board is cut to cross the open region 121 of the first pad 120, a side surface of the first pad 120 may not be covered by the solder resist layer 140, and an upper surface and a side surface of the first pad 120 may be exposed by the first opening 141 in the cross-sectional view of the printed circuit board cut in the direction of line I-I'. A portion of an upper surface and a side surface of the second pad 130 may be covered by the solder resist layer 140, and at least a portion of the surface of the second pad 130 may be exposed through the second opening 142.

Figure 5:
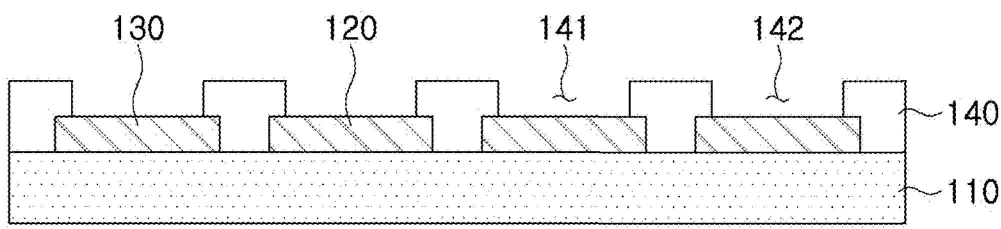
FIG. 5 is a cross-sectional view of a printed circuit board according to the example of FIG. 3 cut in a direction of line II-II'.

FIG. 5 is a cross-sectional view of a printed circuit board according to the example of FIG. 3 cut in a direction of line II-II'.

Referring to the drawings, FIG. 5 is a cross-sectional view of a printed circuit board cut in a direction of crossing the first pad 120 and the second pad 130, including the closed region 122 of the first pad 120, based on the plan view of FIG. 3. The first pad 120 and the second pad 130 may be disposed on the first insulating layer 110, and the solder resist layer 140 may be disposed on the first insulating layer 110.

Since the printed circuit board is cut to cross the closed region 122 of the first pad 120, a portion of an upper surface and a side surface of the first pad 120 may be covered by the solder resist layer 140, and a portion of the upper surface of the first pad 120 may be exposed by the first opening 141 in the cross-sectional view of the printed circuit board cut in the direction of line II-II'. A portion of an upper surface and a side surface of the second pad 130 may be covered by the solder resist layer 140, and at least a portion of the upper surface of the second pad 130 may be exposed through the second opening 142.

Figure 6:
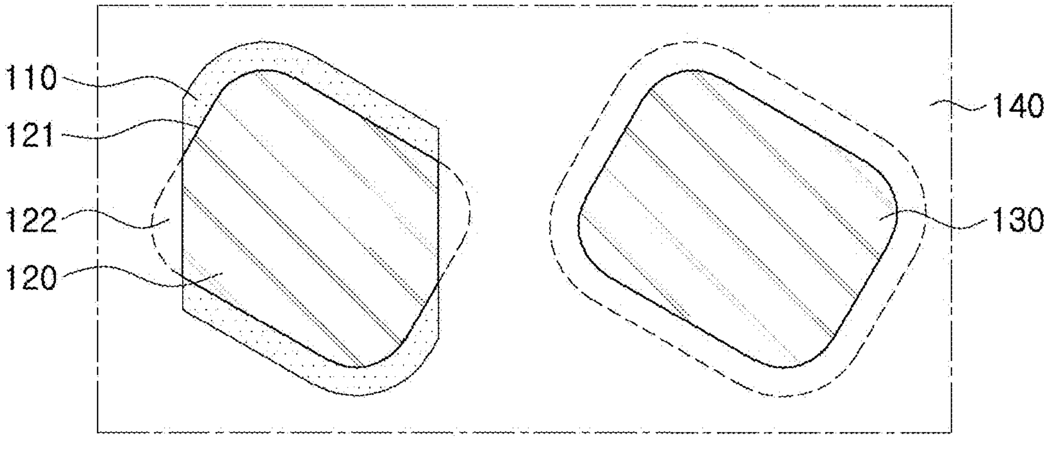
FIG. 6 is an enlarged plan view of region A of FIG. 3.

FIG. 6 is an enlarged plan view of region A of FIG. 3.

Referring to the drawings, in an enlarged plan view of portions of the first pad 120 and the second pad 130, a portion of an upper surface of the first insulating layer 110 may be exposed through the first opening 141. A portion of the surface of the first pad 120 may be covered by the solder resist layer 140, and the other portion of the surface of the first pad 120 may be exposed to the outside through the first opening 141.

At least a portion of an upper surface of the second pad 130 may be covered by the solder resist layer 140, and the other portion of the upper surface of the second pad 130 may be exposed to the outside through the second opening 142.

As described above, an area of the first pad 120 may be smaller than an area of the second pad 130, but the present disclosure is not limited thereto, and the area of the first pad 120 also may not be smaller than the area of the second pad 130, as described above. In addition, an area of a surface of the first opening 141 may be substantially the same as an area of a surface of the second opening 142, but the present disclosure is not limited thereto, and the area of the surface of the first opening 141 or the area of the surface of the second opening 142 may be appropriately adjusted in consideration of a pad size and a relationship with a connection means.

Figures 7, 8:
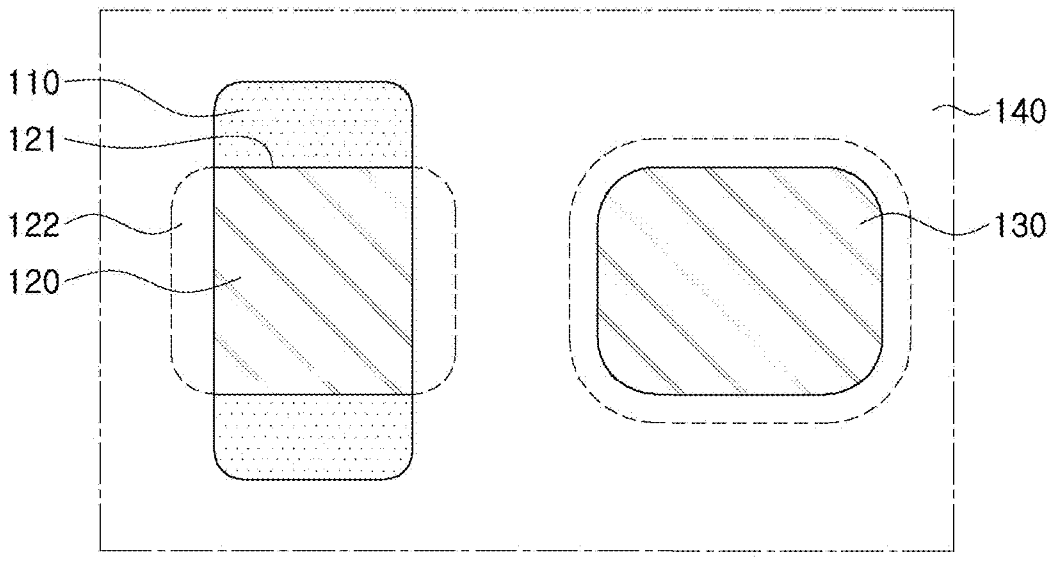
FIG. 7 is an enlarged plan view of region A of a printed circuit board according to another example.
FIG. 8 is an enlarged plan view of region A of a printed circuit board according to another example.

FIG. 7 is an enlarged plan view of region A of a printed circuit board according to another example.

Referring to FIG. 7, the first pad 120 and the second pad 130 of the printed circuit board according to another example may have a quadrangular shape with rounded corners, and may be arranged on a plane without being inclined. The quadrangular shape may be a rectangular shape having one edge longer than the other edge, and may also be a square shape without being limited thereto. However, the present disclosure is not necessarily limited thereto, and the first pad 120 and the second pad 130 may have various shapes. Although the first pad 120 and the second pad 130 have various shapes, the first pad 120 may have the closed region 122 having a side surface covered by the solder resist layer 140 and the open region 121 exposed by the first opening 141, and edge portions and corner portions of the second pad 130 may be covered by the solder resist layer 140.

A configuration same as that of the printed circuit board according to an example among configurations other than the shapes and arrangement of the first pad 120 and the second pad 130 may be applied to the printed circuit board according to another example, and thus a repeated description thereof is omitted.

FIG. 8 is an enlarged plan view of region A of a printed circuit board according to another example.

Referring to FIG. 8, the first pad 120 and the second pad 130 of the printed circuit board according to another example may have a circular shape. Although the first pad 120 and the second pad 130 have a circular shape, the first pad 120 may have the closed region 122 having a side surface covered by the solder resist layer 140 and the open region 121 exposed by the first opening 141, and edge portions and corner portions of the second pad 130 may be covered by the solder resist layer 140.

Among configurations other than the shapes of the first pad 120 and the second pad 130, a configuration the same as that of the printed circuit board according to an example and the printed circuit board according to another example may also be applied to the printed circuit board according to another example, and thus a repeated description thereof is omitted.

Figure 9:
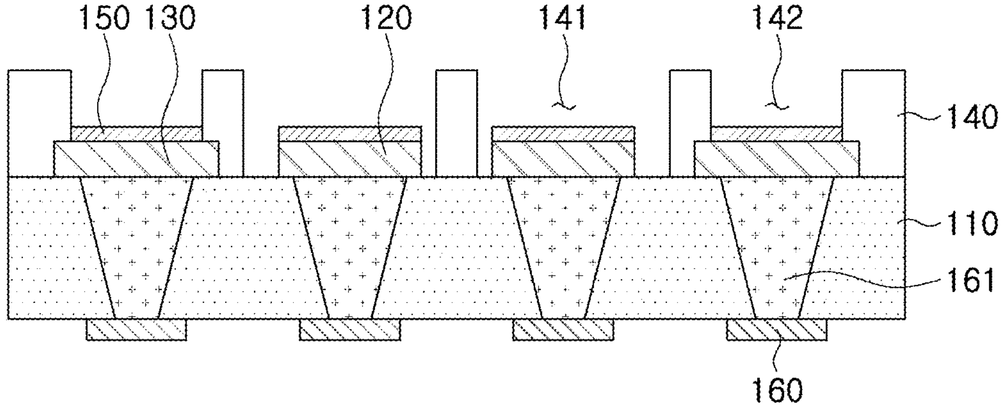
FIG. 9 is a cross-sectional view of a printed circuit board according to another example cut in a direction of line I-I'.

FIG. 9 is a cross-sectional view of a printed circuit board according to another example cut in a direction of line I-I'.

Referring to FIG. 9, the printed circuit board according to another example may further include a surface treatment layer 150 on surfaces of the first pad 120 and the second pad 130. The surface treatment layer 150 may prevent oxidation or contamination of the surfaces of the first pad 120 and the second pad 130, and may allow a connection means to be closely connected to the first pad 120 and the second pad 130. The surface treatment layer 150 may be formed of a metal. For example, the surface treatment layer 150 may include one of metals such as gold (Au) and nickel (Ni), and a plurality of metal layers including one of the metals may be formed. The present disclosure is not limited thereto, and the surface treatment layer 150 may include an organic material. When the organic material is included, the surface treatment layer may be formed by coating of a known organic solderability preservative (OSP) organic film, but the present disclosure is not necessarily limited thereto, and any material usable by those skilled in the art may be used.

In addition, the printed circuit board according to another example may further include a circuit pattern 160, and may further include a connection via 161 connecting the circuit pattern 160 and each of the first pad 120 and the second pad 130 and passing through the first insulating layer 110. The circuit pattern 160 and the connection via 161 may include, but are not limited to, a metal the same as that of the first pad 120 and the second pad 130. The circuit pattern 160 and the connection via 161 may be formed in the same manner as the first pad 120 and the second pad 130, but the present disclosure is not limited thereto. In FIG. 9, the circuit pattern 160 is individually represented, but the present disclosure is not limited thereto, and the circuit pattern 160 may be configured as a patterned metal plate or unpatterned metal plate.

The printed circuit board according to another example is not limited to the configuration illustrated in the drawings, and may further include a plurality of insulating layers, and may further include a circuit pattern and a solder resist layer disposed on another insulating layer in the same manner as the printed circuit board according to an example.

A configuration same as that of the printed circuit board according to an example among other configurations may be applied to the printed circuit board according to another example, a repeated description thereof is omitted.

In the present disclosure, a cross-sectional shape may refer to a cross-sectional shape of an object when the object is vertically cut, or a cross-sectional shape of the object when the object is viewed in a side-view. In addition, a shape on a plane may be a shape of the object when the object is horizontally cut, or a planar shape of the object when the object is viewed in a top-view or a bottom-view.

In the present disclosure, an upper side, an upper portion, the upper surface, or the like is used to refer to a direction toward a surface on which an electronic component is mountable based on a cross-section of a drawing for ease, and a lower side, a lower portion, a lower surface, or the like is used to refer to an opposite direction thereof. However, the above-described directions are defined for ease of description. Thus, it should be understood that the scope of the claims is not particularly limited by the above-described directions.

As used herein, the term "connected" may not only refer to "directly connected" but also include "indirectly connected" by means of an adhesive layer, or the like. The term "electrically connected" may include both of a case in which components are "physically connected" and a case in which components are "not physically connected." In addition, the terms "first," "second," and the like may be used to distinguish a component from another component, and may not limit a sequence and/or an importance, or others, in relation to the components. In some cases, a first component may be referred to as a second component, and similarly, a second component may be referred to as a first component without departing from the scope of the example embodiments.

As used herein, the term "an example embodiment" is provided to emphasize a particular feature, structure, or characteristic, and do not necessarily refer to the same example embodiment. In addition, the particular characteristics or features may be combined in any suitable manner in one or more example embodiments. For example, a context described in a specific example embodiment may be used in other example embodiments, even if it is not described in the other example embodiments, unless it is described contrary to or inconsistent with the context in the other example embodiments.

The terms used herein describe particular example embodiments only, and the present disclosure is not limited thereby. As used herein, singular forms "a," "an," and "the" are intended to include the plural forms as well, unless the context clearly indicates otherwise.

While example embodiments have been shown and described above, it will be apparent to those skilled in the art that modifications and variations could be made without departing from the scope of the present disclosure as defined by the appended claims.

What is claimed is:

1. A printed circuit board comprising:

a first insulating layer;

a plurality of first and second pads disposed on the first insulating layer; and a solder resist layer disposed on the first insulating layer, the solder resist layer having a plurality of first and second openings respectively exposing at least portions of the plurality of first and second pads;

wherein the first pad has a closed region having a side surface covered by the solder resist layer, and an open region having a side surface exposed by the first opening, wherein the second pad has only a closed region having a side surface covered by the solder resist layer, and wherein a distance between the closed region of the first pad and the second pad adjacent to the closed region of the first pad is shorter than a distance between open regions of the first pads adjacent to each other.

2. The printed circuit board of claim 1, wherein a distance between closed regions of the first pads adjacent to each other is shorter than a distance between open regions of the first pads adjacent to each other.

3. The printed circuit board of claim 1, wherein a distance between the closed region of the first pad and the second pad adjacent to the closed region of the first pad is substantially the same as a distance between closed regions of the first pads adjacent to each other.

4. The printed circuit board of claim 1, wherein an area of the first pad is smaller than an area of the second pad.

5. The printed circuit board of claim 1, wherein the solder resist layer is disposed between open regions of the first pads adjacent to each other.

6. The printed circuit board of claim 1, further comprising: a surface treatment layer disposed on the first and second pads.

7. The printed circuit board of claim 1, wherein the first and second pads have one of a circular shape, an elliptical shape, a polygonal shape, and a polygonal shape with rounded corner portions.

8. The printed circuit board of claim 7, wherein the first and second pads have a quadrangular shape with rounded corner portions.

9. The printed circuit board of claim 8, wherein the first and second pads are arranged to be inclined on a plane.

10. The printed circuit board of claim 1, further comprising:

a circuit pattern disposed on a lower surface of the first insulating layer; and a via passing through the first insulating layer and connecting the first and second pads and the circuit pattern to each other.

11. A printed circuit board comprising:

an insulator having first openings and second openings; and first pads and second pads covered by the insulator, wherein each of the first openings exposes at least a portion of an upper surface of each of the first pads and at least a portion of a side surface of each of the first pads, and does not expose another portion of the side surface of each of the first pads, wherein each of the second openings exposes at least a portion of an upper surface of each of the second pads, and does not expose a side surface of each of the second pads, and wherein a shortest distance, measured in plan view, between a covered side-surface portion of a first pad and a side surface of an adjacent second pad is less than a shortest distance, measured in plan view, between exposed side-surface portions of two adjacent first pads.

12. The printed circuit board of claim 11, wherein a corner portion of the upper surface of the second pad and the side surface of the second pad are covered by the insulator.

13. The printed circuit board of claim 11, wherein an area of a surface of the second opening is smaller than an area of the upper surface of the second pad.

14. The printed circuit board of claim 11, wherein at least a portion of a corner portion of the upper surface of the first pad is exposed by the first opening.

15. The printed circuit board of claim 14, wherein the insulator includes an insulating layer and a solder resist layer disposed on the insulating layer, and the first and second openings are disposed in the solder resist layer.

16. A printed circuit board comprising:

an insulating layer;

a first pad and a second pad disposed on the insulating layer; and a solder resist layer disposed on the insulating layer, the solder resist layer having a first opening exposing not entire of an upper surface of the first pad and a second opening exposing only a portion of an upper surface of the second pad, wherein among the first opening and the second opening, only the first opening exposes a portion of the insulating layer, wherein the solder resist layer covers only portions of edges of the upper surface of the first pad, and covers all edges of the upper surface of the second pad, and wherein an edge of the upper surface of the first pad and an edge of the upper surface of the second pad are inclined with respect to an arrangement direction of the first pad and the second pad on the insulating layer.

17. The printed circuit board of claim 16, wherein an area of the first pad is smaller than an area of the second pad.

* * * * *